(12) United States Patent
Hashemi et al.

(10) Patent No.: US 11,563,082 B2
(45) Date of Patent: Jan. 24, 2023

(54) REDUCTION OF DRAIN LEAKAGE IN NANOSHEET DEVICE

(71) Applicant: INTERNATIONAL BUSINESS MACHINES CORPORATION, Armonk, NY (US)

(72) Inventors: Pouya Hashemi, Purchase, NY (US); Takashi Ando, Eastchester, NY (US); Alexander Reznicek, Troy, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 327 days.

(21) Appl. No.: 16/743,256

(22) Filed: Jan. 15, 2020

(65) Prior Publication Data

US 2021/0217846 A1    Jul. 15, 2021

(51) Int. Cl.
| | |
|---|---|
| *H01L 29/06* | (2006.01) |
| *H01L 21/311* | (2006.01) |
| *H01L 21/02* | (2006.01) |
| *H01L 29/49* | (2006.01) |
| *H01L 29/08* | (2006.01) |
| *H01L 29/10* | (2006.01) |
| *H01L 29/66* | (2006.01) |
| *H01L 29/786* | (2006.01) |
| *B82Y 10/00* | (2011.01) |

(52) U.S. Cl.
CPC .... *H01L 29/0665* (2013.01); *H01L 21/02532* (2013.01); *H01L 21/31111* (2013.01); *H01L 29/0653* (2013.01); *H01L 29/0847* (2013.01); *H01L 29/1033* (2013.01); *H01L 29/49* (2013.01); *H01L 29/66553* (2013.01); *H01L 29/78696* (2013.01); *B82Y 10/00* (2013.01)

(58) Field of Classification Search
CPC .......... H01L 29/0665; H01L 21/02532; H01L 21/31111; H01L 29/0653; H01L 29/0847; H01L 29/1033; H01L 29/49; H01L 29/66553; H01L 29/78696; B82Y 10/00
See application file for complete search history.

(56) References Cited

U.S. PATENT DOCUMENTS

| | | |
|---|---|---|
| 9,461,114 B2 | 10/2016 | Obradovic et al. |
| 9,490,323 B2 | 11/2016 | Rodder et al. |
| 10,249,541 B2 | 4/2019 | Cheng et al. |

(Continued)

*Primary Examiner* — Peter Bradford
(74) *Attorney, Agent, or Firm* — Tutunjian & Bitetto, P.C.; Jeffrey S. LaBaw

(57) ABSTRACT

A semiconductor device including at least one nanosheet and epitaxial source and drain regions are present on opposing ends of the at least one nanosheet. A gate structure is present on a channel of the at least one nanosheet. The gate structure includes a first work function metal gate portion present at a junction portion of the source and drain regions that interfaces with the channel portion of the at least one nanosheet, and a second work function metal gate portion present on a central portion of the channel of the at least one nanosheet. The amount of metal containing nitride in the second work function metal gate portion is greater than an amount of metal containing nitride in the first work function metal gate portion. The device further includes a rotated T-shaped dielectric spacer present between the gate structure and the epitaxial source and drain regions.

10 Claims, 7 Drawing Sheets

(56) References Cited

U.S. PATENT DOCUMENTS

| | | |
|---|---|---|
| 10,297,671 B2 | 5/2019 | Bao et al. |
| 11,189,616 B2 * | 11/2021 | Bao ..................... H01L 29/4966 |
| 2017/0069734 A1 * | 3/2017 | Doris .................. H01L 21/0228 |
| 2018/0331232 A1 * | 11/2018 | Frougier ........... H01L 29/78618 |
| 2019/0058052 A1 * | 2/2019 | Frougier ........... H01L 29/66439 |
| 2019/0131394 A1 | 5/2019 | Reznicek et al. |
| 2019/0198645 A1 * | 6/2019 | Cheng ............... H01L 29/66742 |
| 2019/0221483 A1 | 7/2019 | Mulfinger et al. |
| 2020/0098893 A1 * | 3/2020 | Guillorn ............. H01L 29/4966 |
| 2020/0235206 A1 * | 7/2020 | Xu ..................... H01L 29/0847 |

* cited by examiner

US 11,563,082 B2

REDUCTION OF DRAIN LEAKAGE IN NANOSHEET DEVICE

BACKGROUND

Technical Field

The present disclosure relates to semiconductor devices, and more particularly to semiconductor devices including channel regions integrated within nanosheets.

Description of the Related Art

With the continuing trend towards miniaturization of integrated circuits (ICs), there is a need for transistors to have higher drive currents with increasingly smaller dimensions. The use of non-planar semiconductor devices such as, for example, nano-sheet transistors may be the next step in the evolution of complementary metal oxide semiconductor (CMOS) devices.

SUMMARY

In one embodiment, a method of forming a semiconductor device is provided that produces a nanosheet device having a dual work function gate structure and a rotated T-shaped dielectric spacer that reduces gate induced drain leakage (GIDL) and parasitic capacitance in the device. In one embodiment, the method includes forming a stack of layered semiconductor materials. The compositions of the semiconductor materials in the stack provides for selective etching of at least one divot forming material layer to at least one nanosheet providing material layer. A sacrificial gate structure is formed on a channel portion of the layered semiconductor materials. The stack of layered semiconductor materials is etched to provide a divot between nanosheets. A rotated T-shaped dielectric spacer is formed in the divots. Source and drain regions are formed on exposed ends of the nanosheets. A functional gate structure is substituted for the sacrificial gate structure. The functional gate structure includes a first work function metal gate portion having a first thickness of metal nitride at a junction between a channel portion of the nanosheet and the source and drain regions, and a second work function metal gate portion having a second thickness of metal nitride on a channel portion of the nanosheets. The first thickness of the metal nitride is less than the second thickness of the metal nitride.

In another aspect of the present disclosure, a semiconductor device is provided. In one embodiment, the semiconductor device includes at least one nanosheet, and epitaxial source and drain regions are present on opposing ends of the at least one nanosheet. A gate structure is present on a channel of the at least one nanosheet. The gate structure includes a first work function metal gate portion present at a junction portion of the source and drain regions that interfaces with the channel portion of the at least one nanosheet, and a second work function metal gate portion present on a central portion of the channel of the at least one nanosheet. The amount of metal containing nitride in the second work function metal gate portion is greater than an amount of metal containing nitride in the first work function metal gate portion. The device further includes a rotated T-shaped dielectric spacer present between the gate structure and the epitaxial source and drain regions.

In another embodiment, the semiconductor device comprises at least one nanosheet, and epitaxial source and drain regions on opposing ends of the at least one nanosheet. In some embodiments, a gate structure is present on a channel of the at least one nanosheet. The gate structure may include a first work function metal gate portion present at a junction portion of the source and drain regions that interfaces with the channel portion of the at least one nanosheet and a second work function metal gate portion present on a central portion of the channel of the at least one nanosheet. The amount of titanium containing nitride in the second work function metal gate portion is greater than the amount of titanium containing nitride in the first work function metal gate portion. The semiconductor device may include a rotated T-shaped dielectric spacer between the gate structure and the epitaxial source and drain regions. The rotated T-shaped spacer is positioned so that there is no overlap between epitaxial material of the source and drain regions and the first work function metal gate portion and the second work function metal gate portion of the gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1:
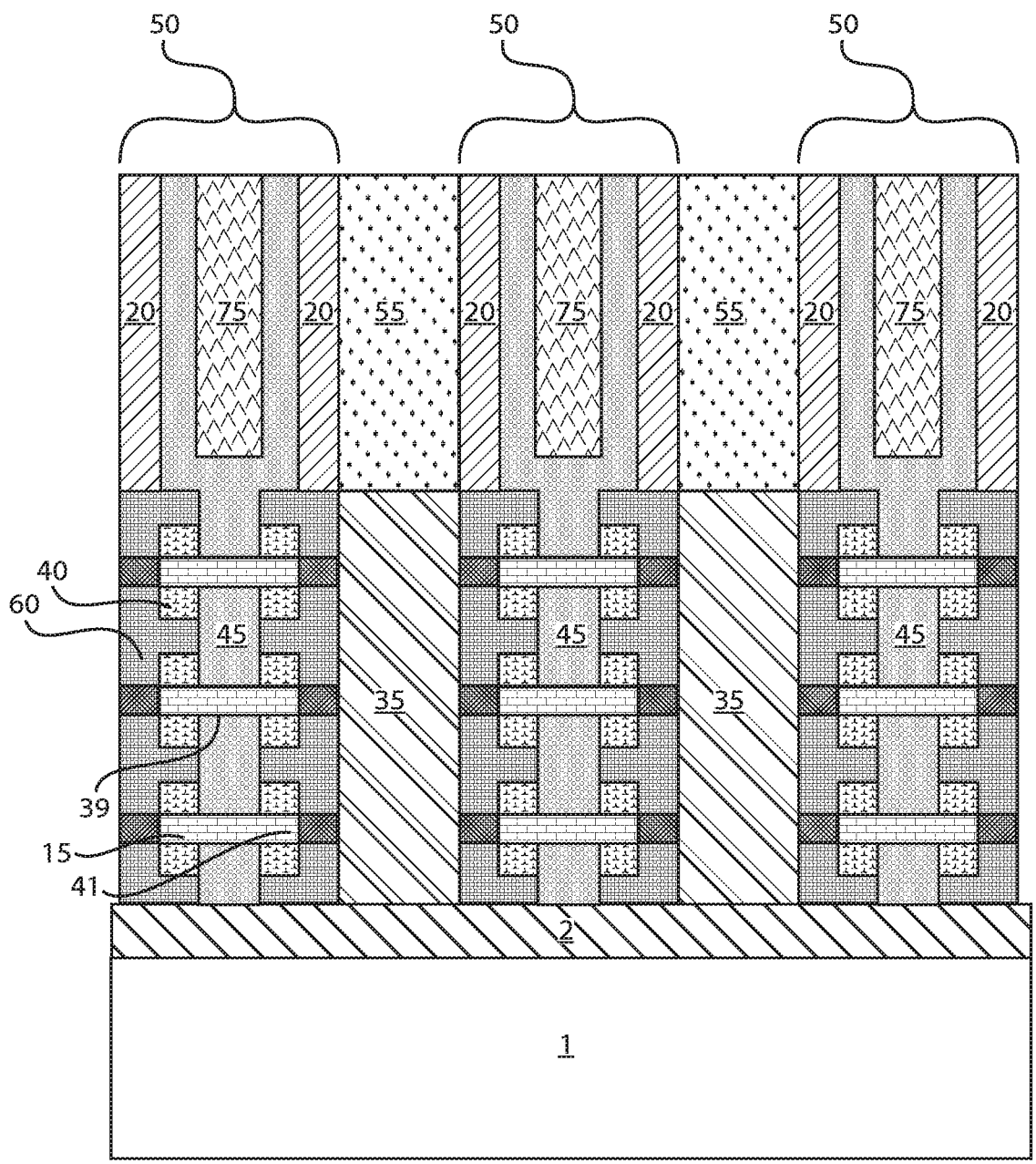
FIG. 1 is a side cross-sectional view of a nanosheet device having a gate all around (GAA) gate structure with a dual work function (WF) metal gate and a rotated T-shaped dielectric spacer to provide reduced parasitic capacitance and reduced gate induced drain leakage (GIDL), in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe structures and methods of forming nanosheet devices with reduced gate induced drain leakage (GIDL) and reduced overlap capacitance. In some embodiments, a nanosheet device has a wrap-around gate structure, which defines a channel region of the device. The term "nanosheet" denotes a substantially two dimensional structure with thickness in a scale ranging from 1 to 100 nm. The width and length dimensions of the nanosheet may be greater than the width dimensions. Source/drain regions are disposed on opposite sides of the channel region.

The tunneling-based leakage currents caused when the gate overlaps the drain is referred to as the gate-induced drain leakage (GIDL). In some examples, under the application of strong vertical and longitudinal fields, the drain region in the overlap region may go into deep depletion as the vertical field tends to invert the region and the longitudinal field sweeps the inverted carriers (holes for n-channel devices). At high fields, the voltage drop across the deep depleted layer may cause trap assisted carrier generation resulting in leakage currents. In some examples, gate-induced drain leakage (GIDL) contributes to stand by power and excessive heat dissipation.

In some scenarios, field dependent gate-induced-drain-leakage (GIDL) can degrade the device performance in the sub-threshold region, as certain applications require very low leakage at the positive supply voltage (VDD). The gate-induced drain leakage (GIDL) worsens with scaling down the electrical thickness at inversion state (Tiny) value for CMOS technology. In some examples, a contributor to the incidence of gate-induced drain leakage (GIDL) can be band-to-band-tunneling, in which the gate-induced drain leakage (GIDL) can increase for higher mobility channels, e.g., channel regions composed of silicon germanium (SiGe), due to the narrower bandgap of these material types. Substrate engineering, such as increase of drain doping density, can help towards mitigating gate-induced drain leakage (GIDL). However, reducing gate-induced drain leakage (GIDL) by increasing drain doping density can be difficult to control for nanosheet devices, because doping in the portion of nanosheets under the inner spacer is difficult to control. Additionally, enabling reduced gate induced drain leakage (GIDL) in the nanosheet devices can include employing dual work-function (WF) gate structures.

In addition, nanosheet (NS) parasitic capacitance formed between replacement metal gate (MG) and the source/drain (S/D) epitaxial semiconductor material (epi) can degrade the circuit delay.

A gate all around (GAA) nanosheet device (NS) technology featuring both low-parasitic capacitance and dual work-function (WF) metal gate (MG) to reduce gate induced drain leakage (GIDL) does not exist prior to the structures and method described herein. The methods and structures described herein provide a gate all around (GAA) stacked nanosheet (NS) structure featuring dual work function (WF) metal gate (MG) enabling both low-overlap capacitance (S/D and MG) and reduced gate induced drain leakage (GIDL).

In some embodiments, the nanosheet structured devices include a spacer having a geometry that when viewed from a side cross sectional view of the device have a "rotated T-shape". The rotated T-shaped spacer may be composed of a solid (single material), and is positioned where the first work function (WF) metal gate (MG) is trapped between the channel portion of the nanosheets and the inner spacer. As will be described further below, with no direct gating, the source/drain (S/D) epitaxial semiconductor material (epi) and the second work function (WF) metal gate (MG) is over the center of the channel.

The methods by which the above noted structure is formed may include a process sequence that includes depositing a stack of alternating layers in the following sequence: $Si_{1}Ge_{x}/Si_{1-y}Ge_{y}/Si/Si_{1-y}Ge_{y}/Si_{1-x}Ge_{x}$ with two different Ge contents. The alternating sequence may repeat within a single stack. The methods described herein can employ germanium (Ge) dependent etch processes to create a dent (also referred to as a divot) and form a "solid rotate T-shape" inner spacer filling at least a portion of the dent. In a following process step, the silicon (Si) channel is released by removing all SiGe layers selectively. The gate dielectric of the gate structure may then be formed on the channel portion of the nanostructures. The electrically conductive portion of the gate structures may then be formed, which typically includes at least two work function (WF) metal gates (MG). As will be further described below, a first work function (WF) metal gate (MG) is formed between the inner spacer dents and the silicon (Si) nanosheet (NS) channel using a deposition process, such as an atomic layer deposition (ALD) forming process, and a material removal process to recess the ALD deposited first work function (WF) metal, such as etching, e.g., reactive ion etching. The second work function (WF) metal gate provides a fill material for the gate structure. Following the formation of the gate structure, the process flow may continue with a complementary metal oxide semiconductor process flow. It is noted that the above described process flow only includes some of the manufacturing steps. A more complete description is provided hereafter. Further details regarding the method and structures of the present disclosure are now described with reference to FIGS. 1-7.

FIG. 1 depicts one embodiment of a nanosheet device 100 having a gate all around (GAA) gate structure 50 with a dual work function (WF) metal gate and a rotated T-shaped dielectric spacer to provide reduced parasitic capacitance and reduced gate induced drain leakage (GIDL). The channel region of the device is provided by nanosheets 5. The term "nanosheet" denotes a substantially two dimensional structure with thickness in a scale ranging from 1 to 100 nm. As used herein, the term "channel" is the region underlying the gate structure and between the source and drain of a semiconductor device that becomes conductive when the semiconductor device is turned on. The nanosheets 5 are composed of a type IV semiconductor, such as a silicon containing material, e.g., silicon (Si).

In the embodiment depicted in FIG. 1, a gate all around (GAA) gate structure 50a is present on the channel region of the nanosheets 5. A "gate structure" means a structure used to control output current (i.e., flow of carriers in the channel) of a semiconducting device, such as a field effect transistor (FET), e.g., nanosheet device. The composition of the gate structure 50 is selected based upon the conductivity type of the device. As used herein, the term "conductivity type" denotes a dopant region being p-type or n-type. As used herein, "p-type" refers to the addition of impurities to an intrinsic semiconductor that creates deficiencies of valence electrons. In a silicon-containing material, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing material examples of n-type dopants, i.e., impurities, include but are not limited to antimony, arsenic and phosphorous. A nanosheet transistor including source regions and drain regions (S/D regions) having n-type conductivity is an n-type nanosheet transistor. A nanosheet transistor including source region and drain regions (S/D region) having a p-type conductivity is referred to as a p-type nanosheet transistor.

The gate structures 50 of the nanosheet devices depicted in FIG. 1 include two work function stacks, e.g., a first work function metal gate (WF1 MG) identified by reference number 40 and a second work function metal gate (WF2 MG) identified by reference number 45. The gate structures 50 including the two work function stacks 40, 45 may be referred to as dual work function gate structures. The gate structures 50 also include at least one gate dielectric 39.

In some embodiments, the compositions selected for the two work function stacks, e.g., work function one metal gate (WF1 MG) identified by reference number 40 and work function two metal gate (WF2 MG) identified by reference number 45, are specific to the conductivity type of the device, and provide the appropriate threshold voltages for the respective N-type or P-type field effect transistor device, as well as providing a reduced oxide field near the bottom of the drain region.

A work function metal gate for an n-type device may be referred to as a "n-type work function adjustment layer", which is a layer that effectuates an n-type (i.e., negative) threshold voltage shift, i.e., a threshold voltage shift that results in a negative threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing nanosheet of the n-type nanosheet semiconductor device. The "conduction band" is the lowest lying electron energy band of the doped material that is not completely filled with electrons.

A work function metal gate for a p-type device may be referred to as a "p-type work function adjustment layer" is layer that can effectuate a p-type (i.e., positive) threshold voltage shift. The term "p-type threshold voltage shift" as used herein means a shift in the Fermi energy of a p-type nanosheet semiconductor device towards a valence band of silicon in the silicon containing nanosheet of the p-type nanosheet semiconductor device. A "valence band" is the highest range of electron energies where electrons are normally present at absolute zero.

In one embodiment, when the gate structure 50 is to an n-type device, e.g., n-type nanosheet device, the first work function metal gate (WF1 MG) portion 40 may include a stack of a first n-type titanium nitride (TiN) layer having a first thickness on the gate dielectric 39 that is present on the channel, an first n-type aluminum containing alloy layer on the first n-type titanium nitride (TiN) layer, and a first cap n-type titanium nitride layer that is formed on the first n-type aluminum containing alloy layer. In some examples, the first n-type aluminum containing alloy layer is composed of titanium aluminum carbide (TiAlC). The first thickness of the first n-type titanium nitride layer in the first work function metal gate portion 40 is selected to be less than the second thickness of the second n-type titanium nitride layer in the second work function metal gate portion 45. This provides that there is a lesser amount of titanium nitride (TiN) at the junction 41 between the channel of the nanosheet 15 and the epitaxial semiconductor material for the source and drain regions 35 than the amount of titanium nitride (TiN) that is present at the central portion of the channel of the nanosheet 15.

In one embodiment, when the gate structure 50 is to an n-type semiconductor device, such as an n-type nanosheet semiconductor device, the second work function metal gate (WF1 MG) portion 45 may include a stack of a second n-type titanium nitride (TiN) layer having a second thickness, a second n-type aluminum-containing alloy, and a second cap n-type titanium nitride layer that is formed on the second n-type aluminum-containing alloy. In some examples, the second n-type aluminum containing alloy layer is composed of titanium aluminum carbide (TiAlC). The second thickness of the second n-type titanium nitride layer in the second work function metal gate portion 45 is selected to be more than the first thickness of the first n-type titanium nitride layer in the first work function metal gate portion 40. This provides that there is a lesser amount of titanium nitride (TiN) at the junction 41 between the channel of the nanosheet 15 and the epitaxial semiconductor material for the source and drain regions 35 than the amount of titanium nitride (TiN) that is present at the central portion of the channel of the nanosheet 15.

This combination of material layers for the gate structure 50 to an n-type nanosheet device can provide that the portion of titanium nitride that is proximate to the drain region portion of the device has a lesser thickness than the portion of titanium nitride that is positioned overlying the main channel portion, e.g., the central portion of the channel of the nanosheets between the source region and the drain region. This arrangement of titanium nitride provides a reduction in the gate induced drain leakage (GIDL).

In one embodiment, when the gate structure 50 is to a p-type device, e.g., p-type nanosheet device, the first work function metal gate (WF1 MG) portion 40 may include a first p-type titanium nitride (TiN) material. In one embodiment, when the gate structure 50 is to a p-type semiconductor device, such as a p-type nanosheet semiconductor device, the second work function metal gate (WF1 MG) portion 45 may include a stack of a second p-type titanium nitride (TiN) layer, a p-type aluminum-containing alloy, and a cap p-type titanium nitride layer that is formed on the second p-type aluminum-containing alloy. In some examples, the p-type aluminum containing alloy layer is composed of titanium aluminum carbide (TiAlC). The thickness of the second p-type titanium nitride layer in the second work function metal gate portion 45 for the p-type device is selected to be greater than the titanium nitride layers, such as first n-type titanium nitride layer in the first work function metal gate portion 40, of the n-type devices. This provides that there is a lesser amount of titanium nitride (TiN) at the junction 41 between the channel of the nanosheet 15 and the epitaxial semiconductor material for the source and drain regions 35 than the amount of titanium nitride (TiN) that is present at the central portion of the channel of the nanosheet 15.

This combination of material layers for the gate structure 50 to the p-type nanosheet device can provide that the portion of titanium nitride that is proximate to the drain region portion of the device has a lesser thickness than the portion of titanium nitride that is positioned overlying the main channel portion, e.g., the central portion of the channel of the nanosheets between the source region and the drain region. This arrangement of titanium nitride provides a reduction in the gate induced drain leakage (GIDL).

In some embodiments, this combination of materials described for the first and second work function metal gates provides appropriate NFET and PFET threshold voltages as well as reduced oxide field near the bottom drain.

FIG. 1 also illustrates a "rotated T-shaped" spacer 60. The term "rotated T-shaped" describes the side cross-sectional geometry of a spacer 60 between the gate structure 50 and the source/drain regions 35 (e.g., a first t-shaped spacer is present between a source region and the gate structure, and a second t-shaped spacer is present between the drain region and the gate structure). The spacer has the geometry of the letter "T" that is rotated approximately 90 degrees to provide that the upper surface of the rotated "T" shape abuts the source and/or drain region 35, and that the base extends to abut a portion of the first work function metal gate portion 40 of the gate structure 40.

The rotated T-shaped spacer 60 provides that there is no overlap between the epitaxial material of the source region and drain region 35 and the gate electrodes of the gate structure 50, e.g., the first work function metal gate portion 40 of the gate structure 50 and the second work function metal gate portion 45 of the gate structure 50. This provides a reduction in parasitic capacitance when compared to similar devices that do not include the rotated T-shaped spacer 60 and/or have an overlap between the epitaxial material of the source/drain region and the electrodes of the gate structure. As illustrated in FIG. 1, the geometry of the rotated T-shaped spacer 60 contributes to the placement of the first work function metal gate portion 40 of the gate structure 50 and the second work function metal gate portion 45 of the gate structure 50 so that a lesser amount of titanium nitride is present at the junction 41 between the channel and the source/drain relative to a more central portion of the channel that is directly underlying the gate structure 50. The structures and features depicted in FIG. 1 are described in more detail with further reference to the method described with reference to FIGS. 2-7.

Figure 2:
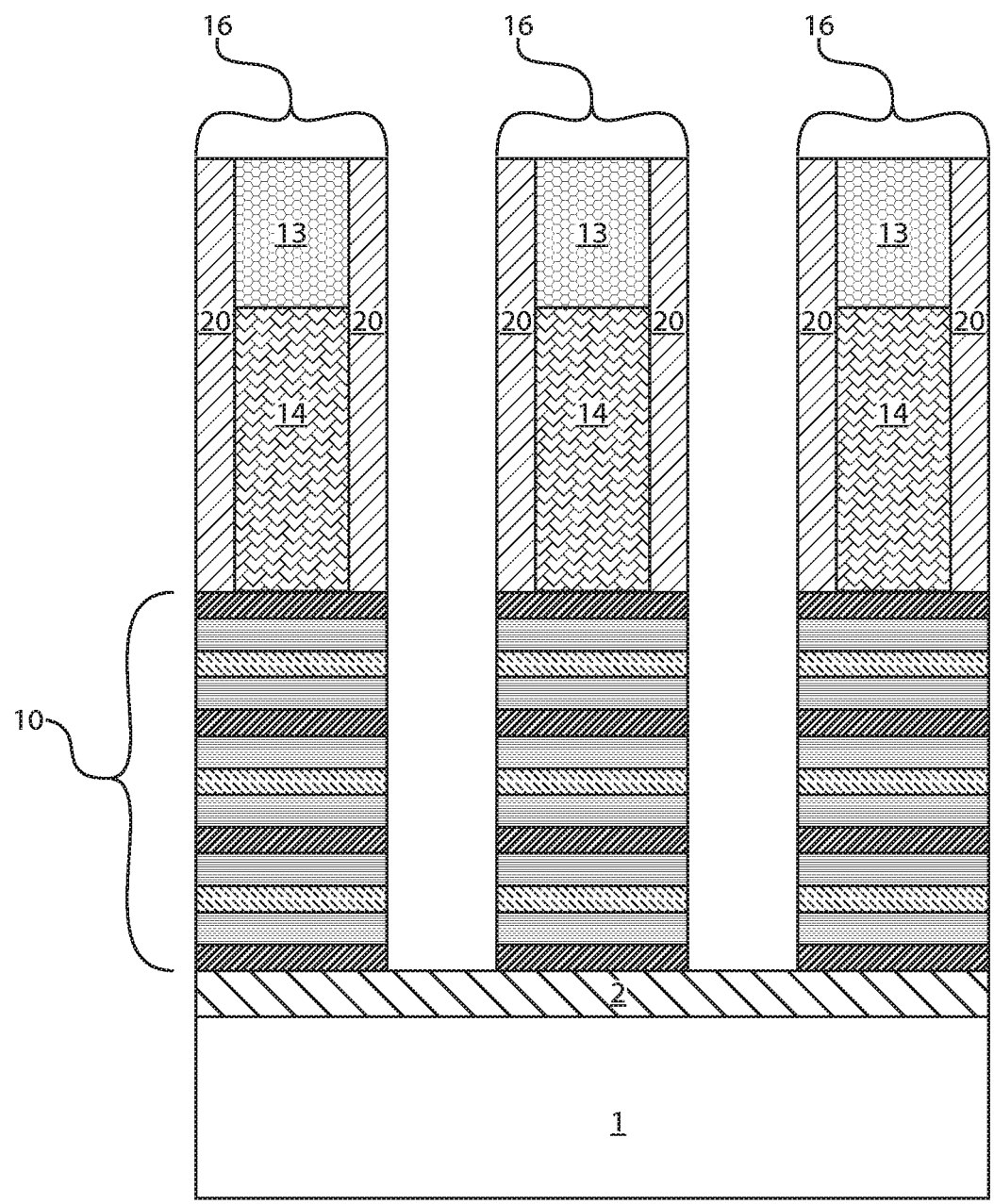
FIG. 2 is a side cross-sectional view of a sacrificial gate structure that has been formed on each stack of the layered semiconductor materials, in which the semiconductor material layers in the stack can be etched selectively to one another for providing a nanosheet device having a dual work function metal gate and a rotated T-shaped dielectric spacer.

FIG. 2 depicts one embodiment of a sacrificial gate structure 15 that has been formed on each stack of layered semiconductor materials 10 that can be etched selectively to one another for providing a nanosheet device 100 having a dual work function metal gate 39, 40, 45, 50 and a rotated T-shaped dielectric spacer 60.

Each of the stacks of layered semiconductor materials 10 includes alternating semiconductor layers in the following sequence: $Si_{1-x}Ge_x/Si_{1-y}Ge_y/Si/Si_{1-y}Ge_y/Si_{1-x}Ge_x$ with two different Ge contents. In the embodiment that is depicted in the supplied figures, the above sequence is repeated three times. However, this is only one example of the present disclosure, and the claimed methods and structures are not limited to only this example, as stacks having a greater or lesser number of repetitions for the above sequence for a single stack are within the scope of the present disclosure. For example, the number of repetitions of the above described sequence of semiconductor materials in the stack may also be equal to 3, 4, 5, 10, 15 and 20, as well as any value between the aforementioned examples.

In one embodiment, a gate sidewall spacer 20 present on sidewalls of the gate structure 16. The gate structure 16 may include at least one sacrificial gate electrode 14 and a hardmask 13. The stack of layered semiconductor materials 10 may be present on a substrate 1. The substrate 1 may be composed of a supporting material, such as a semiconductor material, e.g., silicon, or dielectric material, such as silicon oxide or silicon nitride. In one example, the stack of layered semiconductor materials 10 are present on a buried oxide layer 2, in which the buried oxide layer is present on the supporting substrate 1.

The stack of layered semiconductor materials 10 includes alternating materials that are selected to provide for selectively etching one at least one of the material layers selectively to at least one remaining material layers in a process sequence that forms a recess (also referred to as a divot) to be filled with a dielectric material for the purposes of forming a rotated T-shaped spacer 60. For example, each of the stacks of layered semiconductor materials 10 includes alternating semiconductor layers in the following sequence: $Si_{1-x}Ge_x/Si_{1-y}Ge_y/Si/Si_{1-y}Ge_y/Si_{1-x}Ge_x$ with two different Ge contents. For example, in the above chemical compositions the value of x may be less than the value of y. For example, the value of y can be approximately 30%, and the value of x can be approximately 20%.

In addition to the above example, any type IV semiconductor composition combination and/or III-V semiconductor composition combination is suitable for use with the stacks of layered semiconductor materials 10, as long as the material selection provides for selective etching that is suitable in the process flow for forming the rotated T-shaped spacer 60. For example, the compositions selected for the layers within the stacks of layered semiconductor materials 10 include Si, SiGe, SiGeC, SiC, single crystal Si, polysilicon, i.e., polySi, epitaxial silicon, i.e., epi-Si, amorphous Si, i.e., α:Si, germanium, gallium arsenide, gallium nitride, cadmium telluride and zinc sellenide.

The stack of the layered semiconductor materials 10 may be formed using a deposition process, such as epitaxial deposition. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The thickness of each layer within the stack of the layered semiconductor materials 10 may range from 1 nm to 30 nm. In another embodiment, the thickness of each layer within the stack of the layered semiconductor materials 10 may range from 5 nm to 20 nm.

Still referring to FIG. 2, the process flow may continue with forming a replacement gate structure 16 on a channel portion of the stack of the layered semiconductor materials 10. By "replacement" it is meant that the structure is present during processing of the semiconductor device, but is removed from the semiconductor device prior to the device being completed. In the present process flow, a replacement gate structure 16 is employed as part of a replacement gate process. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material 14 that provides the replacement gate structure 16 may be composed of any material that can be etched selectively to the stack of the layered semiconductor materials 10. In one embodiment, the replacement gate structure 16 may be composed of a silicon-including material, such as polysilicon. In another embodiment, the replacement gate structure 16 may be composed of a dielectric material, such as an oxide, nitride or oxynitride material, or amorphous carbon. The replacement gate structure 16 may be formed using deposition (e.g., chemical vapor deposition) photolithography and etch processes (e.g., reactive ion etching). In some embodiments, a hardmask 13 may be employed to pattern the sacrificial material 14 of the replacement gate structure 16.

Still referring to FIG. 2, a spacer 20 is formed on the sidewall of the replacement gate structure 16. The spacer 20 is typically composed of a dielectric material, such as an oxide, nitride, or oxynitride material. In one example, when the spacer 20 is composed of a nitride, the spacer 20 may be composed of silicon nitride, and when the spacer 20 is composed of oxide, the spacer 20 may be composed of silicon oxide. In another example, the spacer 20 may be composed of a low-k dielectric. In some examples, the low-k dielectric of the spacer 20 may have a dielectric constant of 4.0 or less (measured at room temperature, e.g., 25° C., and 1 atm). For example, a low-k dielectric material suitable for the spacer 20 may have a dielectric constant ranging from about 1.0 to about 3.0. Examples of low-k materials suitable for the spacer 20 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The spacer 20 may be formed using a deposition process, such as chemical vapor deposition (CVD), and an anisotropic etch back method. The spacer 20 may be present on the sidewalls of the replacement gate structure 16, and may have a thickness T1 ranging from 1 nm to 15 nm.

In the embodiment that is depicted in FIG. 2, three replacement gate structures 16 have been formed. The present disclosure is not limited to only this example. Any number of replacement gate structure can be formed, which correlates to any number of nanosheet devices that are desired.

Following formation of the spacer 20 and the replacement gate structures 30, the stack of the layered semiconductor materials 10 may be patterned to provide the geometry of the individual stacks that are depicted in FIG. 2. In some embodiments, the stack of the layered semiconductor materials 10 may be patterned using deposition, photolithography and subtractive etch processing. In one example, each of the stacks 10 may have a height ranging from 5 nm to 200 nm, and a width ranging from 5 nm to 20 nm.

The hardmask 13 of the replacement gate structure 16 and the spacer 20 may be employed as the mask for patterning the stacks 10.

FIG. 2 further depicts etching the exposed portions of the stack of the layered semiconductor materials 10 with a first etch process to provide the three independent stacks. The etch process may be an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. It is noted that FIG. 2 only represents one embodiment of the present disclosure, and the etch process may be practiced providing any number of material stacks, which would correspond to any number of nanosheet devices.

Figure 3:
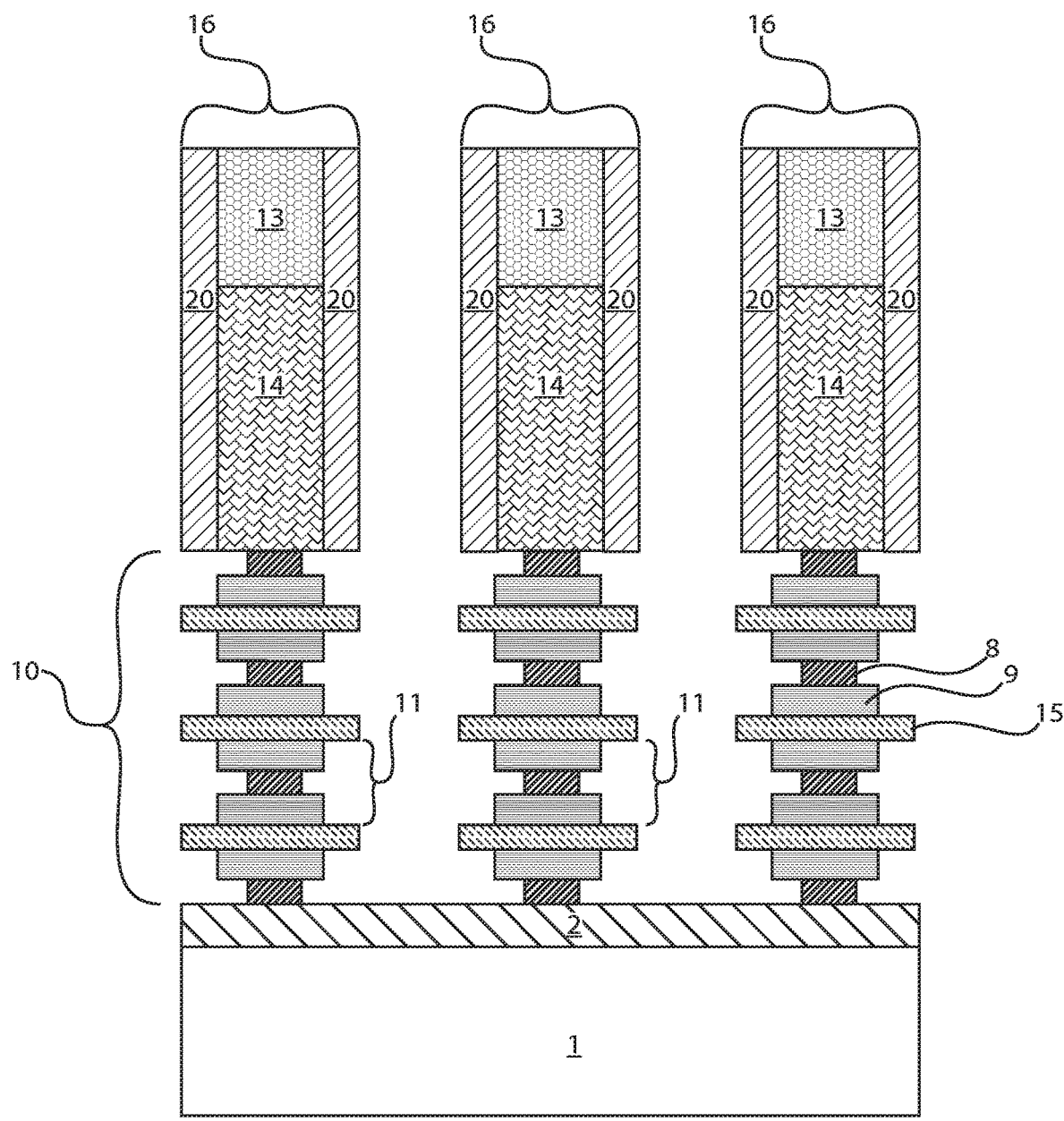
FIG. 3 is a side cross-sectional view of etching the exposed portions of the layered semiconductor materials to create a dent (also referred to as a divot), which can be filled with a dielectric material to provide the rotated T-shaped dielectric spacer, in accordance with the present disclosure.

FIG. 3 depicts etching the exposed portions the stack of the layered semiconductor materials 10 to create a dent 11 (also referred to as a divot), which will be filled with a dielectric material to provide the rotated T-shaped dielectric spacer 50. The stack of layered semiconductor materials 10 includes a sequence of material layers having different compositions that etch at different rates. The different etch rates for the different material layers in the stack of layered semiconductor materials provides that the dent 11 have etched portions that contribute to the formation of the rotated T-shaped dielectric spacer 50.

At least one layer of the stack provides the nanosheet 15, which provides the channel of the device. In some embodiments, the layer that provides the nanosheet 15 has a composition having the lowest etch rate. In one example, when the stacks of layered semiconductor materials 10 includes alternating semiconductor layers in a sequence of $Si_{1-x}Ge_x/Si_{1-y}Ge_y/Si/Si_{1-y}Ge_y/Si_{1-x}Ge_x$, the nanosheet 15 may be provided by the silicon (Si) composition layer. In some embodiments, etch process that removes the material from the layers of the stacks to provide recesses in the stacks for forming the rotated T-shaped dielectric spacer 60 may be selective to the layer of the stacks that provide the nanosheets 15, in which the nanosheets 15 provides the channel regions of the device.

Adjacent to the layer that provides the nanosheets 15, the stacks of layered semiconductor materials 10 have compositions that increase their etch rate to provide the dents (also referred to as divots) that provide the location of the later formed rotated T-shaped dielectric spacer 60. For example, to increase the etch rate for the material layers in the stacks of layered semiconductor materials 10 the germanium (Ge) content may be increased. For example, adjacent to the layer of the stack that provide the nanosheet 15 is a semiconductor layer having a germanium (Ge) content that provides that the layer is etched selectively to the layer that provides the nanosheet 15, and will ultimately be removed to provide a space to be occupied by the first work function metal gate 40. This layer is identified by reference number 9 in FIG. 3. In some embodiments, when the nanosheet layer 15 is composed of silicon (Si), the layers 9 in the stack that are in direct contact with the layers that provide the nanosheets 15 may be composed of silicon germanium ($Si_{1-y}Ge_y$).

The next layers in the stack of layered semiconductor materials 10 that are identified by reference number 8 have a greater germanium content than the layers identified by reference number 9. The increased germanium content in the layers identified by reference number 8 can be etched selectively to both the lesser germanium containing layers identified by reference number 9 and the material layers that do not include germanium, such as the silicon (Si) nanosheets 15. The layers having the greatest etch rate, which are identified by reference number 8 may ultimately be removed to provide the portion of the gate structure in which the gate electrode in that portion of the gate structure only includes the second work function metal gate (WF2 MG). In some embodiments, when the nanosheet layer 15 is composed of silicon (Si), and the layers identified by reference number 9 are composed of silicon germanium ($Si_{1-y}Ge_y$), the layers identified by reference number 8 may be composed of silicon germanium ($Si_{1-x}Ge_x$), in which x<y.

In some embodiments, the etch process that forms the dents 11 in the stack of layered semiconductor materials 10 may be an isotropic etch. By "isotropic" it is meant that the etch process is non-directional. In one embodiment, an isotropic etch, such as a plasma etch or wet chemical etch, may remove a portion of the layers identified by reference numbers 8 and 9 in the stack 10 selectively to the layer that provides the nanosheet 15, in which the etch rate for the material layer having reference number 8 is greater than the etch rate for the material layer having reference number 9. The recess formed in the material layer having reference number 9 has a length that is greater than the length of the recess formed in the material layer having reference number 8.

Figure 4:
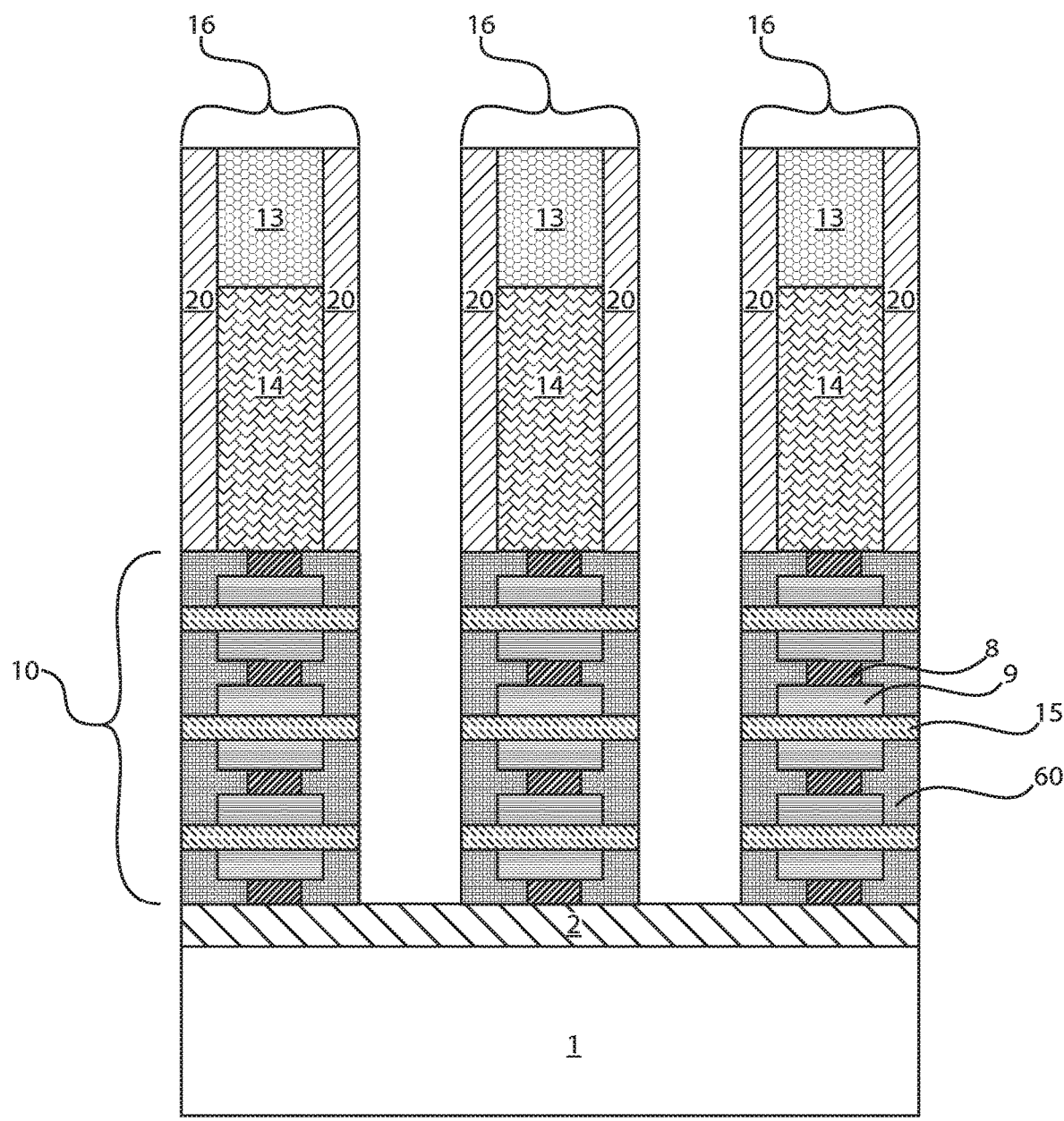
FIG. 4 is a side cross-sectional view depicting depositing the dielectric material followed by an etch back step to fill the dent (also referred to as a divot) and provide the for the rotated T-shaped dielectric spacer, in accordance with one embodiment of the present disclosure.

FIG. 4 depicts depositing the dielectric material followed by an etch back step to fill the dents 11 (also referred to as a divot), and provide the rotated T-shaped dielectric spacer 60. The rotated T-shaped dielectric spacer 60 may also be referred to as an inner spacer. The dielectric for the rotated T-shaped dielectric spacer 60 may be a nitride, such as silicon nitride, and/or a low-k dielectric material. A "low-k" dielectric material is a dielectric having a dielectric constant that is less than the dielectric constant of silicon (Si), e.g., a low-k dielectric material has a dielectric constant less than 4.0 (at room temperature (20° C.-25° C.). Examples of low-k dielectric material suitable for the rotated T-shaped dielectric spacer 60 include silicon oxycarbonitride (SiOCN) material, a silicon carbon oxide (SiCO) material, a silicon carbon nitride (SiCN), a silicon boron carbon nitride (SiBCN) material or a combination thereof. Other examples of low-k dielectrics suitable for the spacer 60 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The dielectric material deposited to fill the dents 11 (also referred to as a divot), and provide the rotated T-shaped dielectric spacer 60 may be deposited using a deposition process, such as a plasma enhanced atomic layer deposition (PEALD) process, an atomic layer deposition (ALD) process, a low pressure chemical vapor deposition (LPCVD) process, a plasma enhanced chemical vapor deposition (PECVD) process or a combination thereof.

The dielectric material for the rotated T-shaped dielectric spacer 60 may be deposited until the dents 11 (also referred to as divots) are filled. Following the deposition process, an etch back step may be performed to remove any overfill of the dielectric that is formed within the dents 11. The etch back step may be provided by an anisotropic etch, such as reactive ion etching (RIE). The etch process may employ the spacers 20 and the hard mask 13 as an etch mask.

Figure 5:
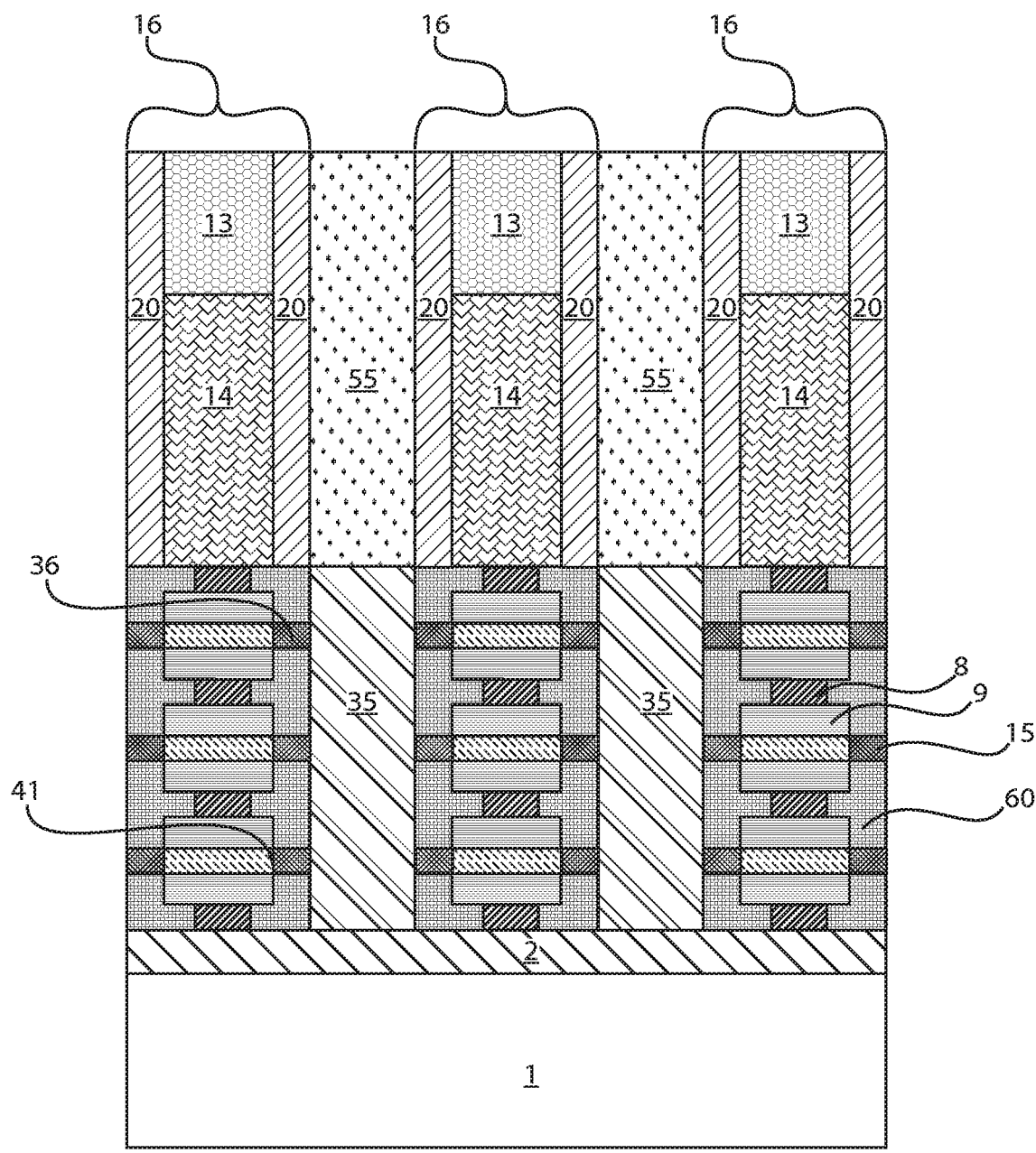
FIG. 5 is a side cross-sectional view depicting one embodiment of forming epitaxial semiconductor material on the source and drain region portions of the nanosheets followed by depositing an interlevel dielectric layer, in accordance with one embodiment of the present disclosure.

FIG. 5 depicts one embodiment of forming epitaxial semiconductor material 35 on the source and drain region portions of the nanosheets 15 followed by depositing an interlevel dielectric layer 55. The epitaxial semiconductor material 35 may provide at least a portion of the source and drain regions of the semiconductor device. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The epitaxial semiconductor material 35 grows from the etched sidewall surface of the nanosheets 15. In some embodiments, the epitaxial semiconductor material 35 may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs).

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material 35 may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material 35 is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In some embodiments, dopant from the epitaxial material is diffused into an end portion of the nanosheets 15 to provide the junction 41 (the diffused dopant region is identified by reference number 36). The dopant may be thermally diffused using an anneal process, such as rapid thermal anneal (RTA), laser anneal, or a combination thereof.

FIG. 5 illustrates one embodiment depicting forming an intralevel dielectric layer 55 having an upper surface that is coplanar with the upper surface of the sacrificial gate structure 16. The intralevel dielectric layer 55 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 50 may be deposited by chemical vapor deposition (CVD), physical vapor deposition (PVD), spin on deposition, deposition from solution or a combination thereof. Following deposition, the upper surface of the intralevel dielectric layer 55 may be planarized until coplanar with the upper surface of the sacrificial gate structure 16. The planarization process may be provided by chemical mechanical planarization.

Figure 6:
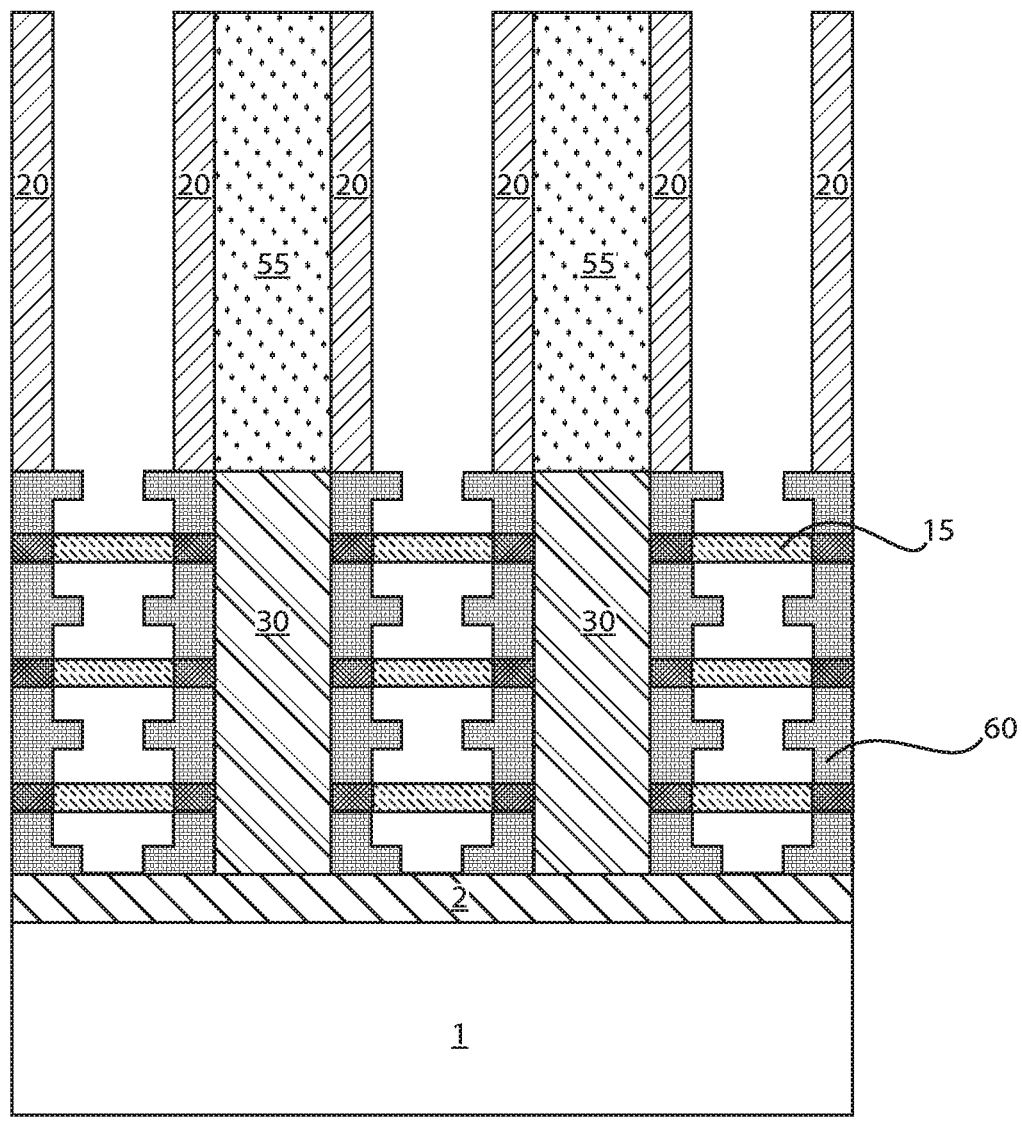
FIG. 6 is a side cross-sectional view depicting removing a replacement gate structure, in accordance with one embodiment of the present disclosure.

FIG. 6 depicts removing a replacement gate structure 16 and removing the germanium containing semiconductor materials 8, 9 of the stacks 10 without removing the nanosheets 15. The replacement gate structure 16 may be removed using a wet or dry etch process. In one embodiment, the replacement gate structure 16 may be removed by at least one of an anisotropic etch process, such as reactive ion etch (RIE), or an isotropic etch process, such as a wet chemical etch. In one example, the etch process for removing the replacement gate structure 16 can include an etch chemistry for removing the replacement gate structure 16 is selective to the material layers of the stack 10.

Following removing the replacement gate structure 16, at least one of the material layers of the stack 10 that contain germanium, such as the material layers having reference numbers 8 and 9, are removed selectively to at least a remaining material composition that provides suspended channel structures, e.g., silicon (Si) nanosheets 15. The etch process for removing the germanium containing material layers, e.g., the material layers having reference numbers 8 and 9, may also be selective to the rotated T-shaped dielectric spacers 60. The etch process for forming the material layers of the stack 10 that contain germanium, such as the material layers having reference numbers 8 and 9, may be a wet chemical etch.

In this example, following removal of the germanium containing material layers of the stack 10, e.g., removal of material layers having reference numbers 8 and 9, a suspended channel structure is provided by the nanosheets 15. By "suspended channel" it is meant that at least one nanosheets 15 is present overlying the substrate 1, wherein the sidewalls of the nanosheets 15 are supported, e.g., anchored, by the rotated T-shaped dielectric spacers 60.

Although FIG. 6 depicts three suspended channel structures, e.g., nanosheets 15, the present disclosure is not limited to only this embodiment. Any number of suspended channel structures, such as suspended nanosheets 15, may be formed using the methods and structures provided by the present disclosure.

Figure 7:
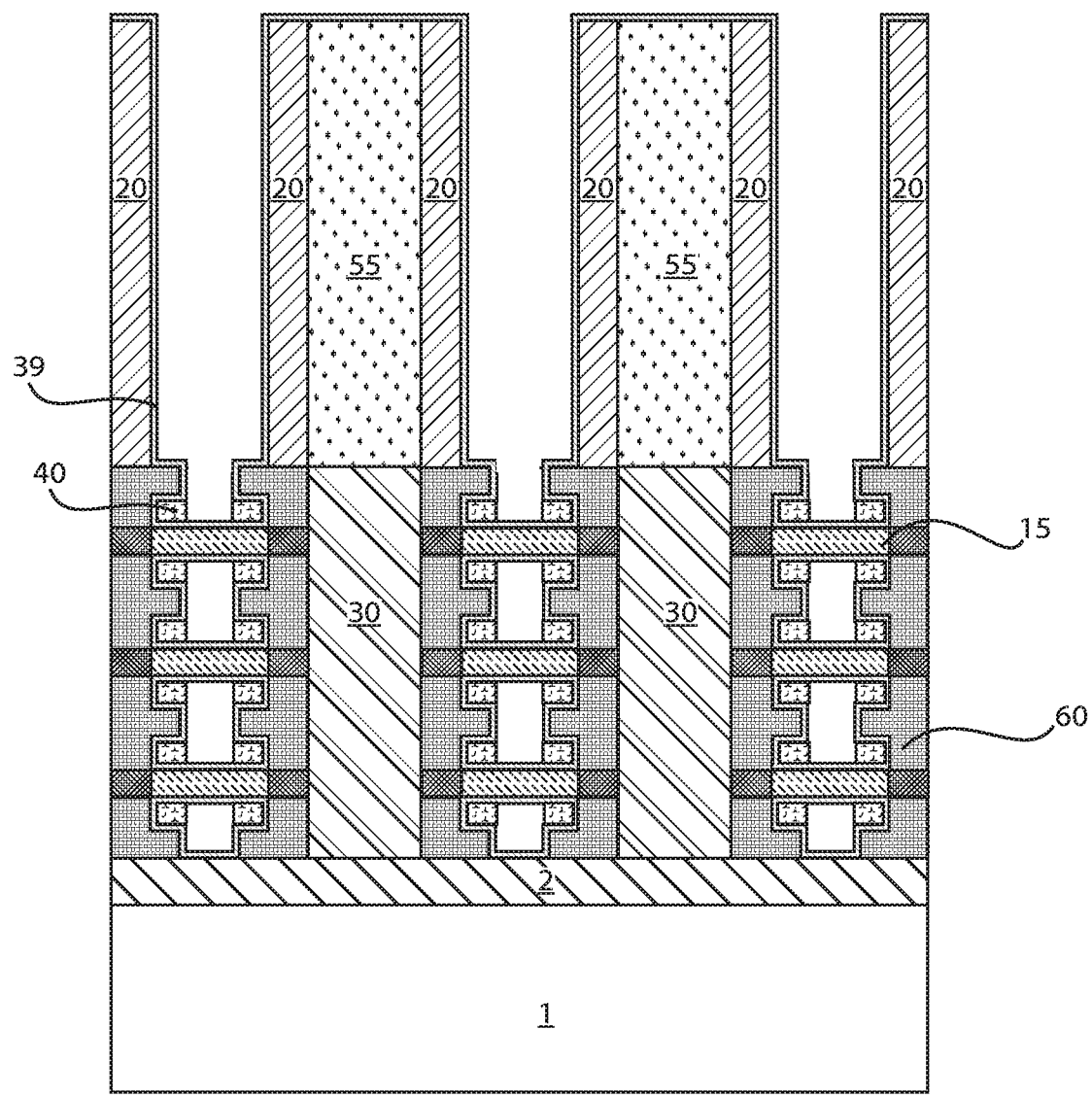
FIG. 7 is a side cross-sectional view depicting forming a functional gate structure in the gate opening that is formed by removing the replacement gate structure, in accordance with one embodiment of the present disclosure.

FIG. 7 depicts forming the gate dielectric layer 39, and a functional gate structure 50 in the gate opening that is formed by removing the replacement gate structure 16. The functional gate structure 50 operates to switch the semiconductor device from an "on" to "off" state, and vice versa. The functional gate structure 50 may be formed by first depositing at least one gate dielectric 39 on the nanosheets 15 providing the suspended channel structures of the semiconductor device followed by filling the void with the first and second work function metal gate portions 40, 45, as well as a metal gate fill 75.

The gate dielectric layer 39 can be formed on the entirety of the exterior surface of the nanosheets 15 that provide the suspended channel structures. The gate dielectric layer 39 may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiOXN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric layer 39 can be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation. The gate dielectric layer 39 may be a conformally deposited layer.

Still referring to FIG. 7, following the formation of the gate dielectric layer 39, a first work function metal gate (WF1 MG) portion 40 of the dual work function metal gate structure 50 is formed. The first work function metal gate (WF1 MG) portion 40 of the gate structure 50 may be formed using a deposition process. In some embodiments, the deposition process may include physical vapor deposition (PVD), such as sputtering. In some embodiments, the deposition process may also include plating, such as electroplating and/or electroless plating. In some embodiments, the deposition process may also include chemical vapor deposition (CVD), such as plasma enhanced chemical vapor deposition (PECVD).

The first work function metal gate (WF1 MG) portion 40 of the gate structure 50 is formed in the space between the nanosheets 15 and a portion of the rotated T-shaped dielectric spacer 60 that extends in a direction towards the channel region of the device, as depicted in FIG. 7. An etch back process may be employed to remove overfill of the material that was deposited for the first work function metal gate (WF1 MG) portion 40 that extends outside the space between the nanosheets 15 and a portion of the rotated T-shaped dielectric spacer 60 that extends in a direction towards the channel region of the device. The etch back process may include an anisotropic etch, such as reactive ion etching.

Referring to FIG. 1, following formation of the first work function metal gate (WF1 MG) portion 40 of the gate structure 50, the second work function metal gate (WF2 MG) portion 45 of the gate structure 50 is deposited within the remaining portion of the gate opening not filled by the first work function metal gate (WF1 MG) portion 40. The second work function metal gate (WF2 MG) portion 45 may completely fill the portion of the functional gate structure surrounding the nanosheets 15. In some embodiments, a metal gate fill 75 may be formed in an upper portion of the gate opening that is overlying the nanosheets 15.

The second work function metal gate (WF1 MG) portion 45 of the gate structure 50 may be formed using a deposition process. In some embodiments, the deposition process may include physical vapor deposition (PVD), such as sputtering. In some embodiments, the deposition process may also include plating, such as electroplating and/or electroless plating. In some embodiments, the deposition process may also include chemical vapor deposition (CVD), such as plasma enhanced chemical vapor (PECVD).

In one embodiment, when the gate structure 50 is to an n-type semiconductor device, such as an n-type nanosheet semiconductor device, the second work function metal gate (WF1 MG) portion 45 may include a stack of a second n-type titanium nitride (TiN) layer having a second thickness, a second n-type aluminum-containing alloy, and a second cap n-type titanium nitride layer that is formed on the second n-type aluminum-containing alloy. In some examples, the second n-type aluminum containing alloy layer is composed of titanium aluminum carbide (TiAlC). The second thickness of the second n-type titanium nitride layer in the second work function metal gate portion 45 is selected to be more than the first thickness of the first n-type titanium nitride layer in the first work function metal gate portion 40. This provides that there is a lesser amount of titanium nitride (TiN) at the junction 41 between the channel of the nanosheet 15 and the epitaxial semiconductor material for the source and drain regions 35 than the amount of titanium nitride (TiN) that is present at the central portion of the channel of the nanosheet 15. This combination of material layers for the gate structure 50 to an n-type nanosheet device can provide that the portion of titanium nitride that is proximate to the drain region portion of the device has a lesser thickness than the portion of titanium nitride that is positioned overlying the main channel portion, e.g., the central portion of the channel of the nanosheets between the source region and the drain region. This arrangement of titanium nitride provides a reduction in the gate induced drain leakage (GIDL).

In one embodiment, when the gate structure 50 is to a p-type semiconductor device, such as a p-type nanosheet semiconductor device, the second work function metal gate (WF2 MG) portion 45 may include a stack of a second p-type titanium nitride (TiN) layer, a p-type aluminum-containing alloy, and a cap p-type titanium nitride layer that is formed on the second p-type aluminum-containing alloy. In some examples, the p-type aluminum containing alloy layer is composed of titanium aluminum carbide (TiAlC). The thickness of the second p-type titanium nitride layer in the second work function metal gate portion 45 for the p-type device is selected to be greater than the titanium nitride layers, such as first n-type titanium nitride layer in the first work function metal gate portion 40, of the n-type devices. This provides that there is a lesser amount of titanium nitride (TiN) at the junction 41 between the channel of the nanosheet 15 and the epitaxial semiconductor material for the source and drain regions 35 than the amount of titanium nitride (TiN) that is present at the central portion of the channel of the nanosheet 15. This arrangement of titanium nitride provides a reduction in the gate induced drain leakage (GIDL).

The material layers for forming the second work function metal gate portion 45 may be deposited using a conformal deposition process. The second work function metal gate portion 45 may fill the lower portion of the gate opening surrounding the nanosheets 15, however a void may be present in the upper portion of the gate opening. A metal gate fill 75 can be deposited in the void at the upper portion of the gate opening.

The metal gate fill 75 may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The at least one gate conductor can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
   at least one nanosheet;
   epitaxial source and drain regions on opposing ends of the at least one nanosheet;
   a gate structure present on a channel of the at least one nanosheet, the gate structure including a first work function metal gate portion present at a junction portion of the source and drain regions that interfaces with the channel portion of the at least one nanosheet and a second work function metal gate portion present on a central portion of the channel of the at least one nanosheet, wherein an amount of metal containing nitride in the second work function metal gate portion is greater than an amount of metal containing nitride in the first work function metal gate portion; and
   a rotated T-shaped dielectric spacer is between the gate structure and the epitaxial source and drain regions.

2. The semiconductor device of claim 1, wherein the rotated T-shaped dielectric spacer comprises silicon nitride.

3. The semiconductor device of claim 1, wherein the rotated T-shaped dielectric spacer comprises a low-k dielectric having a composition selected from the group consisting of silicon oxycarbonitride (SiOCN) material, a silicon carbon oxide (SiCO) material, a silicon carbon nitride (SiCN), a silicon boron carbon nitride (SiBCN) material and combinations thereof.

4. The semiconductor device of claim 1, wherein at least one of the first work function metal gate portion and the second work function metal gate portion further comprises an aluminum containing material layer.

5. The semiconductor device of claim 1, wherein the rotated I-shaped spacer is positioned so that there is no overlap between the epitaxial source and drain regions and the first work function metal gate portion and the second work function metal gate portion of the gate structures.

6. The semiconductor device of claim 1, wherein the metal nitride in at least one of the first work function metal gate portion and the second work function metal gate portion is titanium nitride.

7. The semiconductor device of claim 1, wherein at least one of the first work function metal gate portion and the second work function metal gate portion further comprises an aluminum containing material layer.

8. The semiconductor device of claim 7, wherein the aluminum containing material layer is titanium aluminum carbide (TiAlC).

9. The semiconductor device of claim 1, wherein the functional gate structure comprises a gate dielectric of a high-k material.

10. A semiconductor device comprising:
- at least one nanosheet;
- epitaxial source and drain regions on opposing ends of the at least one nanosheet;
- a gate structure present on a channel of the at least one nanosheet, the gate structure including a first work function metal gate portion present at a junction portion of the source and drain regions that interfaces with the channel portion of the at least one nanosheet and a second work function metal gate portion present on a central portion of the channel of the at least one nanosheet, wherein an amount of titanium containing nitride in the second work function metal gate portion is greater than an amount of titanium containing nitride in the first work function metal gate portion; and
- a rotated T-shaped dielectric spacer is between the gate structure and the epitaxial source and drain regions, wherein the rotated T-shaped spacer is positioned so that there is no overlap between epitaxial material of the source and drain regions and the first work function metal gate portion and the second work function metal gate portion of the gate structure.

* * * * *